(12) United States Patent
Clingman et al.

(10) Patent No.: US 7,426,373 B2
(45) Date of Patent: Sep. 16, 2008

(54) ELECTRICALLY TUNED RESONANCE CIRCUIT USING PIEZO AND MAGNETOSTRICTIVE MATERIALS

(75) Inventors: Dan J Clingman, Auburn, WA (US); Frederick T. Calkins, Renton, WA (US)

(73) Assignee: The Boeing Company, Chicago, IL (US)

(*) Notice: Subject to any disclaimer, the term of this patent is extended or adjusted under 35 U.S.C. 154(b) by 495 days.

(21) Appl. No.: 11/032,866

(22) Filed: Jan. 11, 2005

(65) Prior Publication Data
US 2006/0154617 A1    Jul. 13, 2006

(51) Int. Cl.
H04B 1/04    (2006.01)
H04B 1/18    (2006.01)
H03B 5/08    (2006.01)

(52) U.S. Cl. .......... 455/121; 455/123; 455/193.3; 455/193.1; 455/77; 331/167; 331/73

(58) Field of Classification Search .......... 455/77, 455/121–123, 193.1–193.3; 343/702, 745, 343/860, 861
See application file for complete search history.

(56) References Cited

U.S. PATENT DOCUMENTS

| | | | | |
|---|---|---|---|---|
| 2,884,632 A * | 4/1959 | De Witz et al. | ......... | 343/850 |
| 3,474,453 A * | 10/1969 | Ireland | ......... | 343/745 |
| 3,571,716 A * | 3/1971 | Hill et al. | ......... | 455/193.3 |
| 3,611,154 A * | 10/1971 | Kupfer | ......... | 455/180.1 |
| 4,057,771 A * | 11/1977 | Schmidt | ......... | 333/168 |
| 4,493,112 A * | 1/1985 | Bruene | ......... | 455/123 |
| 4,730,195 A * | 3/1988 | Phillips et al. | ......... | 343/792 |
| 4,764,773 A * | 8/1988 | Larsen et al. | ......... | 343/713 |
| 4,837,852 A * | 6/1989 | Takada et al. | ......... | 455/193.3 |
| 5,040,239 A * | 8/1991 | Kondo et al. | ......... | 455/193.1 |
| 6,466,774 B1 * | 10/2002 | Okabe et al. | ......... | 455/150.1 |
| 6,862,432 B1 * | 3/2005 | Kim | ......... | 455/80 |
| 6,993,297 B2 * | 1/2006 | Smith, Jr. | ......... | 455/82 |

OTHER PUBLICATIONS

Flatau, et al., "High bandwidth tunability in a smart vibration absorber," 1998 SPIE Smart Structures and Materials Conf. Paper #3329-19/3327-42, pp. 1-11.
Etrema Products, Inc., "What is Terfenol-D?", http://etrema-usa.com/core/terfenold, as of Sep. 11, 2004, p. 1 of 1.

* cited by examiner

Primary Examiner—Duc M Nguyen
(74) Attorney, Agent, or Firm—Harness, Dickey & Pierce, P.L.C.

(57) ABSTRACT

An impedance tuning system, especially for a cellular telephone system. The system can be used to match the impedance of an antenna element with that of an output stage of a transmitter driving the antenna element. The system includes a piezo capacitor in parallel with the magnetostrictive inductor to form an LC circuit. A voltage controller applies a voltage bias signal to the piezo capacitor and a current controller applies a current bias signal to the inductor. A primary controller monitors the frequency of the output signal from the transmitter and controls the voltage and current controllers as needed to alter the impedance of the system as needed to match the impedance of the antenna element with that of the output stage of the transmitter. In an alternative form an ultrasonic sensor is provided.

18 Claims, 1 Drawing Sheet

ELECTRICALLY TUNED RESONANCE CIRCUIT USING PIEZO AND MAGNETOSTRICTIVE MATERIALS

FIELD OF THE INVENTION

This invention relates to antenna tuning devices, and more particularly to an electrically controlled antenna tuning circuit that matches an impedance of a transmitter with the impedance of an antenna element associated with the transmitter.

BACKGROUND OF THE INVENTION

For optical performance, electromagnetic wave transmitters require that the transmitter output stage impedance match the antenna that the transmitter is driving. The impedance match is a function of frequency. Accordingly, a variation in the frequency of the signal being output from the transmitter alters its output impedance, thus requiring the antenna impedance to change, too, to maintain the impedance match.

Traditionally, impedance matching has been accomplished with mechanical tuned inductors and capacitors. However, modern transmitters often change frequency at millisecond time intervals, which precludes mechanical adjustments to inductors and/or capacitors. Thus, with modern transmitters, impedance matching has been accomplished by changing the capacitance of an impedance matching circuit used with the antenna through the use of diodes. The capacitance of a reverse biased diode varies with bias voltage. This phenomenon is exploited by connecting the reversed biased diode to an inductor. Varying the diode bias will change the resonance of the inductor diode circuit. However, the use of diodes limits the dynamic range of tuning. The range that the capacitance of a reversed biased diode that can be varied over is limited and the inductor inductance is fixed, so the range that the resonance can be changed is limited.

Accordingly, it would be desirable to provide an impedance matching system that monitors the frequency of a transmitter and automatically adjusts the impedance of an antenna element being driven by the transmitter, in real time, to maintain the impedance of the antenna element matched with the impedance of the output stage of the transmitter.

SUMMARY OF THE INVENTION

The present invention is directed to an impedance matching system. In one preferred form the system includes a piezo capacitor and a magnetostrictive inductor coupled in parallel. A voltage controller is used to control a bias voltage applied to the piezo capacitor while a current controller is used to control a bias current applied to the magnetostrictive inductor. The piezo capacitor and magnetostrictive inductor cooperatively form an adjustable resonance circuit that is coupled to an antenna element. A primary controller monitors a frequency of the signal transmitted from an electromagnetic wave transmitter and controls the voltage and current controllers to alter the impedance of the tunable resonance circuit so that the impedance of the antenna element matches the output impedance of the transmitter. More specifically, the primary controller controls the voltage and current controllers so that the bias voltage applied to the piezo capacitor and/or the bias current applied to the magnetostrictive inductor is changed as needed, in real time, to maintain the impedance of the antenna matched to the output impedance of the transmitter.

In an alternative preferred embodiment an ultrasonic sensor is provided. The sensor includes a piezoelectric wafer secured to a structure experiencing an unknown vibration signal. The piezoelectric wafer is secured in parallel with a magnetostrictive inductor that forms an LC circuit. A user control is used to control a biasing system that applies at least one of a bias voltage or a bias current to the piezoelectric wafer or the inductor, respectively. The user control enables a user to tune the LC circuit to different frequencies. An amplifier is responsive to an output of the LC circuit and provides a signal to a data logging subsystem that indicates when the LC circuit is tuned to its resonant frequency.

As the user varies the user control, the piezoelectric wafer will excite the LC circuit only when the LC circuit is tuned to its resonant frequency. At this point the amplifier will detect this condition by a change in the voltage across the LC circuit. The amplifier generates an output that is applied to the data logging subsystem that indicates to the user that the LC circuit is at its resonant frequency.

The features, functions, and advantages can be achieved independently in various embodiments of the present inventions or may be combined in yet other embodiments.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
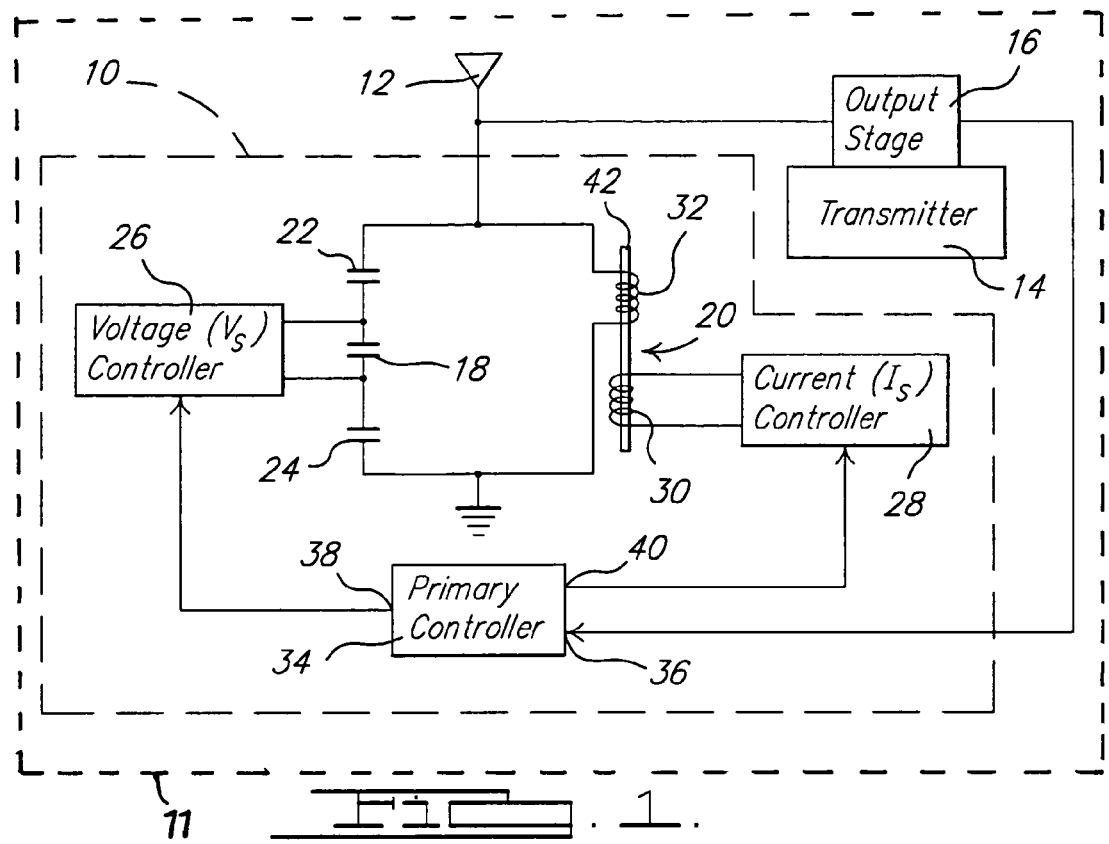
FIG. 1 is an illustration of an impedance matching circuit in accordance with a preferred embodiment of the present invention.

Referring to FIG. 1, an impedance matching system 10 is shown in accordance with a preferred embodiment of the present invention. The impedance matching system 10 is included within a cellular telephone 11. The system 10 is electrically coupled to an antenna element 12 and to an output stage 16 of an electromagnetic wave transmitter 14. The system 10, however, can be employed in any application where it is desired to match the impedance of a first electrical component with the impedance of a second electrical component.

The system 10 includes a non-linear piezo capacitor 18 coupled in parallel to a magnetostrictive inductor 20. A pair of blocking capacitors 22 and 24 are coupled in series with the piezo capacitor 18. Voltage blocking capacitors 22 and 24 have a capacitance preferably in the range of about 1 µF-10 µF. A voltage controller 26 is coupled across the piezo capacitor 18 and applies a voltage bias signal to the piezo capacitor 18. A current controller 28 is coupled to a first coil 30 of the magnetostrictive inductor 20 and applies a bias current to the inductor 20. A second coil 32 is coupled across the blocking capacitors 22 and 24. Collectively, the piezo capacitor 18 and the magnetostrictive inductor 20 form a variable resonance circuit.

The system 10 also includes a primary controller 34 having an input 36 coupled to the output stage 16 of the transmitter 14. A first output 38 of the primary controller 34 is used to apply a control signal to the voltage controller 26 that varies the bias voltage output signal from the voltage controller 26. A second output 40 of the primary controller 34 is used to apply a control signal to the current controller 28 that varies the bias current applied to the magnetostrictive inductor 20.

The piezo capacitor 22 can be formed from any non-linear piezo material. Suitable materials may include PZT and single crystal PMN-PT. Such materials exhibit a large change in capacitance as a function of bias voltage, typically on the order of 5:1 with bias field changes between 0 and 2 Megavolts/meter.

The magnetostrictive inductor 20 has a core 42 made from magnetostrictive material that exhibits large changes in magnetic permeability as a function of magnetic field bias. The material might be Terfenol-D, Falfenol, or another magnetostrictive alloy made from elements including terbium, dysprosium, gallium and iron.

In operation, the primary controller 34 monitors the frequency of the signal generated by the output stage 16 of transmitter 14, via input 36. the primary controller applies control signals via outputs 38 and 40 to the voltage controller 26 and current controller 28. The voltage controller 28 changes the bias voltage applied to piezo capacitor 18 while the current controller 28 changes the bias current applied to coil 30 of the magnetostrictive inductor 20. The resonant frequency of the circuit formed by the piezo capacitor 18 and the magnetostrictive inductor 20 is thus varied as needed to alter the impedance of the antenna element 12 to match the impedance of the output stage 16 of the transmitter 14.

A principal advantage of the system 10 is its ability to react to changes in frequency of the output signal being applied to the antenna 12 in real time. An additional advantage is that by avoiding the use of diodes as a tuning component, the system 10 achieves a greater dynamic range than can be achieved with a diode-based impedance tuning circuit by a factor of about 2.5. The system 10 is particularly desirable in cellular phone applications although it could be used in any application where it is desirable to match the impedance of a transmitter that outputs a frequency-varying signal to an antenna that radiates the signal.

Figure 2:
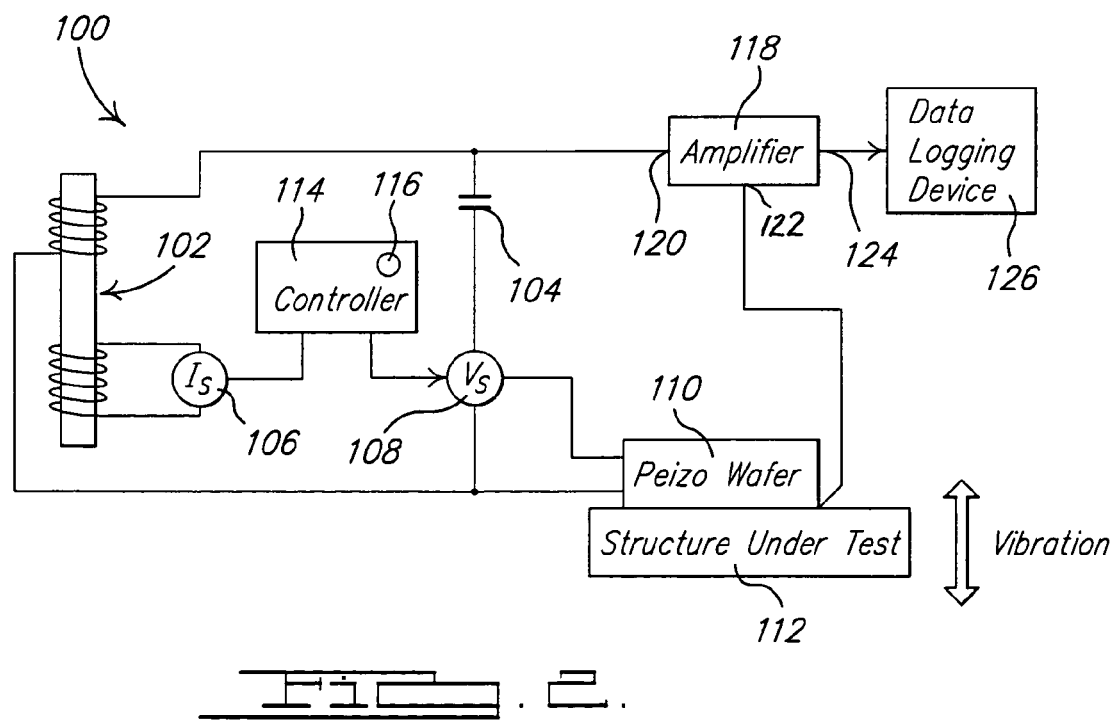
FIG. 2 is a diagram of an ultrasonic sensor in accordance with an alternative preferred embodiment of the present invention.

FIG. 2 illustrates an ultrasonic sensor 100. The sensor 100 includes a magnetostrictive inductor 102 coupled in parallel with a blocking capacitor 104. A current controller 106 applies a variable current bias signal to the magnetostrictive inductor 102, while a voltage controller 108 applies a variable DC bias voltage to a non-linear piezoelectric wafer 110. The inductor 102 and non-linear piezoelectric wafer 110 essentially form an adjustable LC circuit. Non-linear piezoelectric wafer 110 could be comprised of PZT or a single crystal PMN-PT, or other suitable non-linear piezoelectric material such as PZN-PT The magnetostrictive inductor 102 may be formed from Terfenol-D, Galfenol, or another magnetostrictive alloy made from elements like dysprosium, terbium, gallium and iron.

The piezoelectric wafer 110 is bonded to a structure 112 being tested. In practice, the structure 112 experiences a vibration at an unknown frequency. A controller 114 controls the current controller 106 and also the voltage controller 108. The controller 114 includes a user control input 116 to allow a desired frequency to be selected by a user, or a frequency bandwidth to be "swept" with the user input 116. Control 116 essentially directs the controller 114 to adjust the voltage and current bias signals from controllers 106 and 108 in an attempt to tune the LC circuit to a desired frequency or to scan (i.e., "sweep") a desired bandwidth. The gain of the LC circuit will be at a maximum only when the piezoelectric wafer 110 is experiencing a high frequency vibration signal that tunes the LC circuit to its resonant frequency. At other vibration frequencies, the gain of the LC circuit will be substantially zero.

An amplifier 118 has inputs 120 and 122 coupled to the magnetostrictive inductor 102 and the piezoelectric wafer 110, respectively, and an output 124. Output 124 is coupled to an input of data logging device 126. Blocking capacitor 104 prevents the DC bias voltage from voltage controller 108 from being applied to the amplifier input 120, as well as across the magnetostrictive inductor 102.

In operation, the control input 116 is adjusted by the user while the structure 112 under test is experiencing a vibration signal. The control input 116 may be incrementally set at discrete steps or slowly manually swept over its full range. When the resonant frequency of the LC circuit is detected the LC circuit generates an output to the amplifier input 120 which is amplified by the amplifier 118. The amplifier 118 generates an output signal at output 124 that is transmitted to the data logging device 126. The data logging device 126 records the signals and processes the data to determine the health of the structure being monitored.

While various preferred embodiments have been described, those skilled in the art will recognize modifications or variations which might be made without departing from the inventive concept. The examples illustrate the invention and are not intended to limit it. Therefore, the description and claims should be interpreted liberally with only such limitation as is necessary in view of the pertinent prior art.

What is claimed is:

1. A tuning apparatus for tuning an impedance of an antenna coupled to an electromagnetic wave transmitter, the apparatus comprising:
    a piezoelectric capacitor;
    a magnetostrictive inductor coupled in parallel with the piezoelectric capacitor to form a resonance circuit, said resonance circuit being in electrical communication with said antenna;
    a biasing circuit for biasing each of said piezoelectric capacitor and said magnetostrictive inductor to thus alter a resonant frequency of said resonance circuit;
    said biasing circuit including:
        a voltage controller for controlling a bias voltage applied to said piezoelectric capacitor; and
        a current controller for controlling a bias current applied to said magnetostrictive inductor; and
    a controller for generating a pair of independent control signals applied independently to said voltage controller and to said current controller to independently control a magnitude of each of said biasing current and said bias voltage, to control said biasing circuit in accordance with a frequency of said transmitter to match said impedance of said antenna to said impedance of said transmitter.

2. The apparatus of claim 1, wherein said controller is responsive to an output of said transmitter.

3. An electrically tunable antenna, comprising:
    an antenna element;
    an electromagnetic wave energy transmitter for generating electromagnetic wave signals applied to said antenna element;
    a piezoelectric material forming a piezoelectric capacitor;
    an inductor including a magnetostrictive material, the inductor disposed in parallel and in electrical communication with said piezoelectric capacitor to form an electrically variable resonance circuit, the resonance circuit being electrically coupled to said antenna to control an impedance of said antenna;
    a voltage supply for providing a bias voltage to said piezoelectric capacitor to alter a capacitance of said piezoelectric capacitor;

a current supply for providing a bias current to said magnetostrictive material to alter an inductance of said inductor; and a controller responsive to said transmitter for generating independent control signals for controlling said biasing voltage generated by said voltage supply and biasing current generated by said current supply independently of one another, to control said resonance circuit to match an impedance of said antenna element to an impedance of said transmitter.

4. The electrically tunable antenna of claim 3, wherein said controller is responsive to a frequency of said signals being output from said electromagnetic wave energy transmitter.

5. The electrically tunable antenna of claim 3, wherein said current supply comprises a current controller.

6. The electrically tunable antenna of claim 3, wherein said voltage supply comprises a voltage controller.

7. The electrically tunable antenna of claim 3, further comprising a pair of direct current blocking capacitors disposed in series with said piezoelectric capacitor on opposite sides of said piezoelectric capacitor.

8. The electrically tunable antenna of claim 3, wherein said magnetostrictive material comprises an alloy including terbium, dysprosium and iron.

9. The electrically tunable antenna of claim 3, wherein said magnetostrictive material comprises at least one alloy including mixtures of at least two of terbium, dysprosium, gallium and iron.

10. The electrically tunable antenna of claim 3, wherein said inductor comprises a first coil and a second coil wrapped around said magnetostrictive material, with said first coil being coupled in parallel across said piezoelectric capacitor and said second coil being coupled in parallel with said current supply.

11. A cellular telephone, comprising:
an antenna element;
a transmitter for generating electromagnetic wave signals applied to an input of said antenna element;
a non-linear piezoelectric capacitor;
a magnetostrictive inductor forming an inductor, the inductor being disposed in parallel with said piezoelectric capacitor, and in electrical communication with said input of said antenna element, to form an electrically controllable resonance circuit;
a voltage source for providing a bias voltage to said piezoelectric capacitor to alter a capacitance of said piezoelectric capacitor;
a current source for providing a bias current to said magnetostrictive inductor to alter an inductance of said magnetostrictive inductor; and
a controller responsive to a frequency of said signals from said transmitter, for generating a first control signal for independently controlling an output of said voltage source, and generating a second control signal for controlling an output of said current source independently of said voltage source, to control said resonance circuit in real time so that an impedance of said antenna element matches an output impedance of said transmitter.

12. The electrically tunable antenna of claim 11, wherein said magnetostrictive inductor comprises a core, and wherein the core includes an alloy including mixtures of at least two of terbium, dysprosium, gallium and iron.

13. An electrically tunable resonance circuit for altering an impedance of an electrical component, said circuit comprising:
a piezoelectric capacitor;
a magnetostrictive inductor coupled in parallel to said capacitor to form a resonance circuit, said resonance circuit being in electrical communication with said electrical component;
a biasing system for providing a biasing voltage to said piezoelectric capacitor and a biasing current to said magnetostrictive inductor;
said biasing system including:
a voltage controller for controlling a bias voltage applied to said piezoelectric capacitor; and
a current controller for controlling a bias current applied to said magnetostrictive inductor; and
a controller for generating a pair of independent control signals applied independently to said voltage controller and to said current controller to independently control a magnitude of each of said biasing current and said bias voltage in accordance with a frequency of a signal being applied to said electrical component, to selectively alter said impedance of said electrical component.

14. The circuit of claim 13, wherein said controller controls said biasing voltage and said biasing current in real time to enable real time adjustment of said impedance of said electrical component.

15. The circuit of claim 13, wherein said controller controls said biasing system, in real time, to match an external electrical component generating said signal.

16. A method for tuning an antenna, comprising
using a piezoelectric capacitor and a magnetostrictive inductor to form an impedance matching circuit;
biasing at least one of said piezoelectric capacitor and said magnetostrictive inductor to alter an impedance of said impedance matching circuit in accordance with a frequency of a signal being applied to said antenna, to thus controllably alter an impedance of said antenna to match an impedance of a component generating said signals;
said biasing including:
using a voltage controller to independently control a bias voltage applied to said piezoelectric capacitor;
a current controller to independently control a bias current applied to said magnetostrictive inductor; and
using a controller for generating a pair of independent control signals applied independently to said voltage controller and to said current controller to independently control a magnitude of each of said biasing current and said bias voltage, to control said impedance of said antenna to match that of said component generating said signal.

17. The method of claim 16, further comprising:
monitoring said frequency of said signal in real time and adjusting said impedance of said impedance matching circuit in real time as needed to continuously match said impedance of said antenna with said component generating said signal.

18. The method of claim 17, further comprising using a controller to monitor said frequency of said signal and to control biasing of said piezoelectric capacitor and said magnetostrictive inductor.

* * * * *